(12) United States Patent
Yamamoto

(10) Patent No.: US 7,646,176 B2
(45) Date of Patent: Jan. 12, 2010

(54) CONTROLLER FOR RECHARGEABLE BATTERY AND TEMPERATURE ESTIMATION METHOD AND DETERIORATION DETERMINATION METHOD FOR RECHARGEABLE BATTERY

(75) Inventor: Takao Yamamoto, Aichi (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 412 days.

(21) Appl. No.: 11/564,459

(22) Filed: Nov. 29, 2006

(65) Prior Publication Data

US 2007/0120537 A1 May 31, 2007

(30) Foreign Application Priority Data

Nov. 30, 2005 (JP) ............................. 2005-346756

(51) Int. Cl.
H02J 7/00 (2006.01)
H02J 7/16 (2006.01)
G01N 27/416 (2006.01)

(52) U.S. Cl. .................... 320/150; 320/134; 320/136; 320/152; 324/426; 324/430

(58) Field of Classification Search ................. 320/134, 320/136, 150, 152; 324/426, 430, 431, 441
See application file for complete search history.

(56) References Cited

U.S. PATENT DOCUMENTS

| | | | | |
|---|---|---|---|---|
| 5,886,527 A * | 3/1999 | Ito | ............................. | 324/431 |
| 6,106,972 A * | 8/2000 | Kokubo et al. | ............. | 429/120 |
| 6,262,577 B1 * | 7/2001 | Nakao et al. | ................ | 324/425 |
| 7,443,139 B2 * | 10/2008 | Mitsui et al. | ................ | 320/134 |
| 2003/0087148 A1 * | 5/2003 | Minamiura | .................. | 429/62 |
| 2003/0231006 A1 * | 12/2003 | Tojima | ....................... | 320/132 |

FOREIGN PATENT DOCUMENTS

| | | |
|---|---|---|
| JP | 2001-086601 | 3/2001 |
| JP | 2001-313092 | 11/2001 |

* cited by examiner

Primary Examiner—Edward Tso
Assistant Examiner—Johali A Torres Ruiz
(74) Attorney, Agent, or Firm—Workman Nydegger

(57) ABSTRACT

A controller for a rechargeable battery and a temperature estimation method and a deterioration determination method for a rechargeable battery enabling an accurate battery temperature to be obtained through calculation. The controller calculates a heat generation amount of Joule heat generated in the rechargeable battery and a heat generation amount of chemical reaction heat generated in the rechargeable battery to calculate the battery temperature of the rechargeable battery based on the calculated Joule heat generation amount and the calculated chemical reaction heat generation amount. When a cooling device is connected to the rechargeable battery, the controller preferably calculates the battery temperature of the rechargeable battery using the Joule heat generation amount, the chemical reaction heat generation amount, and a value indicating the cooling capability of the cooling device.

20 Claims, 8 Drawing Sheets

Fig.4

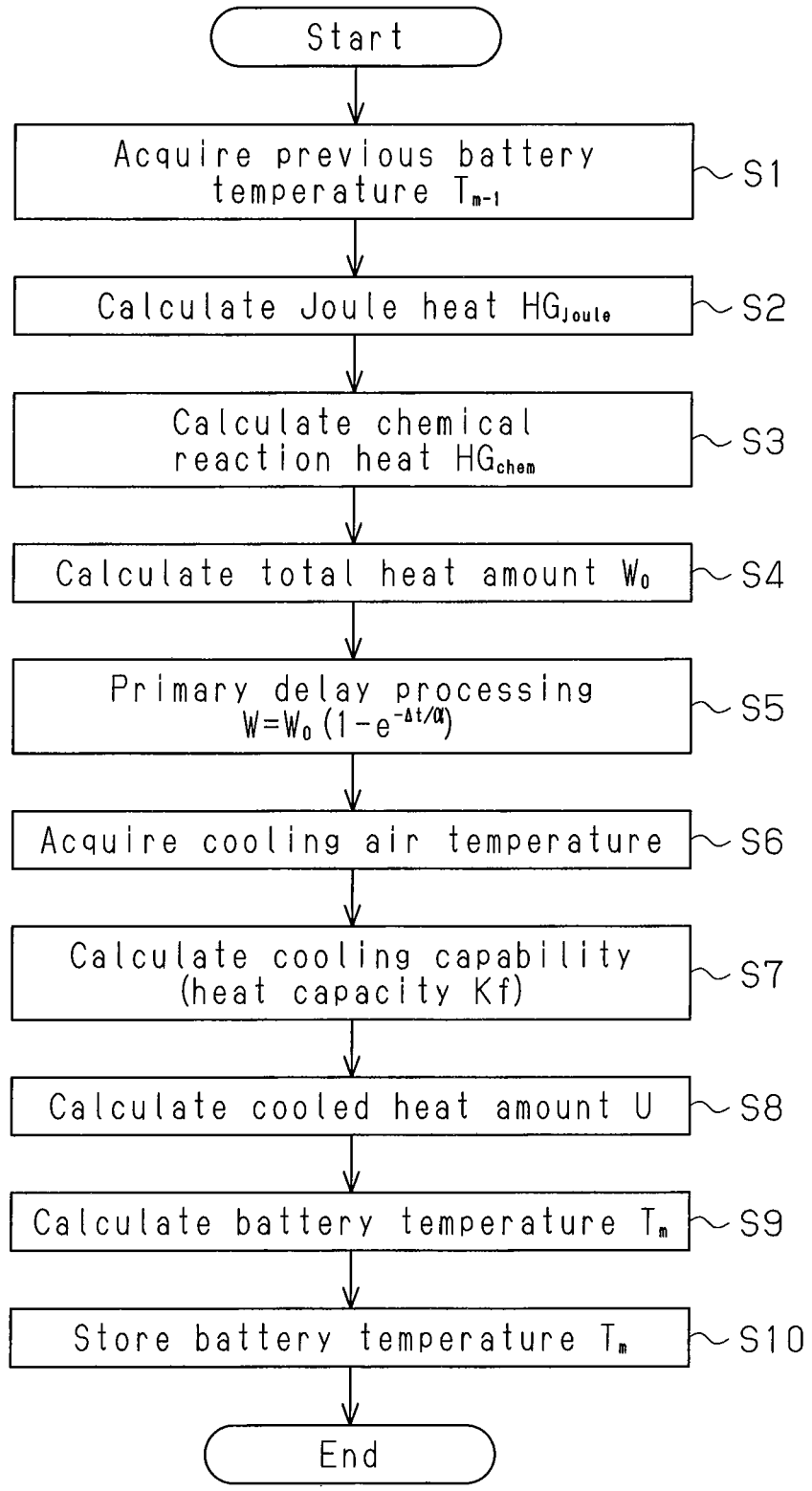

- Start
- Acquire previous battery temperature $T_{m-1}$ — S1
- Calculate Joule heat $HG_{Joule}$ — S2
- Calculate chemical reaction heat $HG_{chem}$ — S3
- Calculate total heat amount $W_0$ — S4
- Primary delay processing $W = W_0(1 - e^{-\Delta t/\alpha})$ — S5
- Acquire cooling air temperature — S6
- Calculate cooling capability (heat capacity $Kf$) — S7
- Calculate cooled heat amount $U$ — S8
- Calculate battery temperature $T_m$ — S9
- Store battery temperature $T_m$ — S10
- End ically showing a process for
CONTROLLER FOR RECHARGEABLE
BATTERY AND TEMPERATURE
ESTIMATION METHOD AND
DETERIORATION DETERMINATION
METHOD FOR RECHARGEABLE BATTERY

CROSS-REFERENCE TO RELATED APPLICATIONS

This application is based upon and claims the benefit of priority from the prior Japanese Patent Application No. 2005-346756, filed on Nov. 30, 2005, the entire contents of which are incorporated herein by reference.

BACKGROUND OF THE INVENTION

The present invention relates to a controller for a rechargeable battery, a method for estimating the temperature of a rechargeable battery, and a method for determining deterioration of a rechargeable battery with the temperature estimation method.

In recent years, rechargeable batteries have been combined with fuel cells, solar cells, or power generators to form power supply systems. A power generator is driven by natural power, such as wind power or water power, or by artificial power, such as power generated by an internal combustion engine. A power supply system using a rechargeable battery stores excess power in the rechargeable battery to improve energy efficiency.

An example of a power supply system is a hybrid electric vehicle (HEV) using an engine and a motor as its power sources. When the engine outputs more power than necessary to drive the vehicle, the HEV drives its generator using the excessive power to charge the rechargeable battery. When the vehicle is braking or decelerating, the HEV drives the motor with the vehicle wheels and charges the rechargeable battery using the motor as a power generator. When the engine outputs less power than necessary, the HEV compensates for the lack of power by discharging the rechargeable battery and driving the motor.

In this way, the HEV accumulates energy in the rechargeable battery. Conventional automobiles release such energy into the atmosphere as heat. The energy efficiency of an HEV is higher than the energy efficiency of a conventional automobile. Thus, the HEV greatly improves fuel efficiency as compared with conventional automobiles.

The electrochemical reaction of the rechargeable battery occurring when the rechargeable battery is charged or discharged is dependent on the temperature of the rechargeable battery. In the power supply system, the rechargeable battery, which is typically formed by a plurality of cells connected in series, generates a large amount of heat. Further, the rechargeable battery may have its performance lowered or its life shortened when the temperature of the rechargeable battery exceeds a predetermined temperature. Japanese Laid-Open Patent Publication Nos. 2001-313092 and 2001-86601 describe examples of techniques for adjusting the temperature of a rechargeable battery with a cooling fan.

Further, the battery temperature must be accurately obtained in a power supply system to efficiently operate the cooling fan or determine abnormalities in the cooling fan. With the techniques described in the above publications, the temperature of the rechargeable battery is obtained using a battery temperature measured by a temperature sensor and a battery temperature obtained through calculation. The calculation of the battery temperature is based on the amount of Joule heat generated when the rechargeable battery is charged or discharged and the cooling capability of the cooling fan.

However, the rechargeable battery actually involves not only generation of Joule heat but also other types of heat. Thus, the accuracy of the battery temperature calculated through the conventional techniques is low. As a result, the temperature of the rechargeable battery obtained through the conventional techniques may be inaccurate. A highly accurate temperature sensor may be used to solve this problem. However, the cost of such a highly accurate temperature sensor is high.

Initial deterioration of the rechargeable battery is also detectable if the accurate battery temperature of the rechargeable battery is obtained through calculation and compared with the battery temperature measured by the temperature sensor. In this way, it is important to obtain accurate battery temperature of the rechargeable battery through calculation.

SUMMARY OF THE INVENTION

The present invention provides a controller for a rechargeable battery and a method for estimating the temperature of a rechargeable battery that enable an accurate battery temperature to be obtained through calculation, and a method for determining deterioration of a rechargeable battery using the temperature estimation method.

BRIEF DESCRIPTION OF THE DRAWINGS

The invention, together with objects and advantages thereof, may best be understood by reference to the following description of the presently preferred embodiments together with the accompanying drawings in which:

FIG. 4 is a flowchart showing a temperature estimation method for a rechargeable battery in the preferred embodiment;

DETAILED DESCRIPTION OF THE PREFERRED EMBODIMENTS

Figure 1:
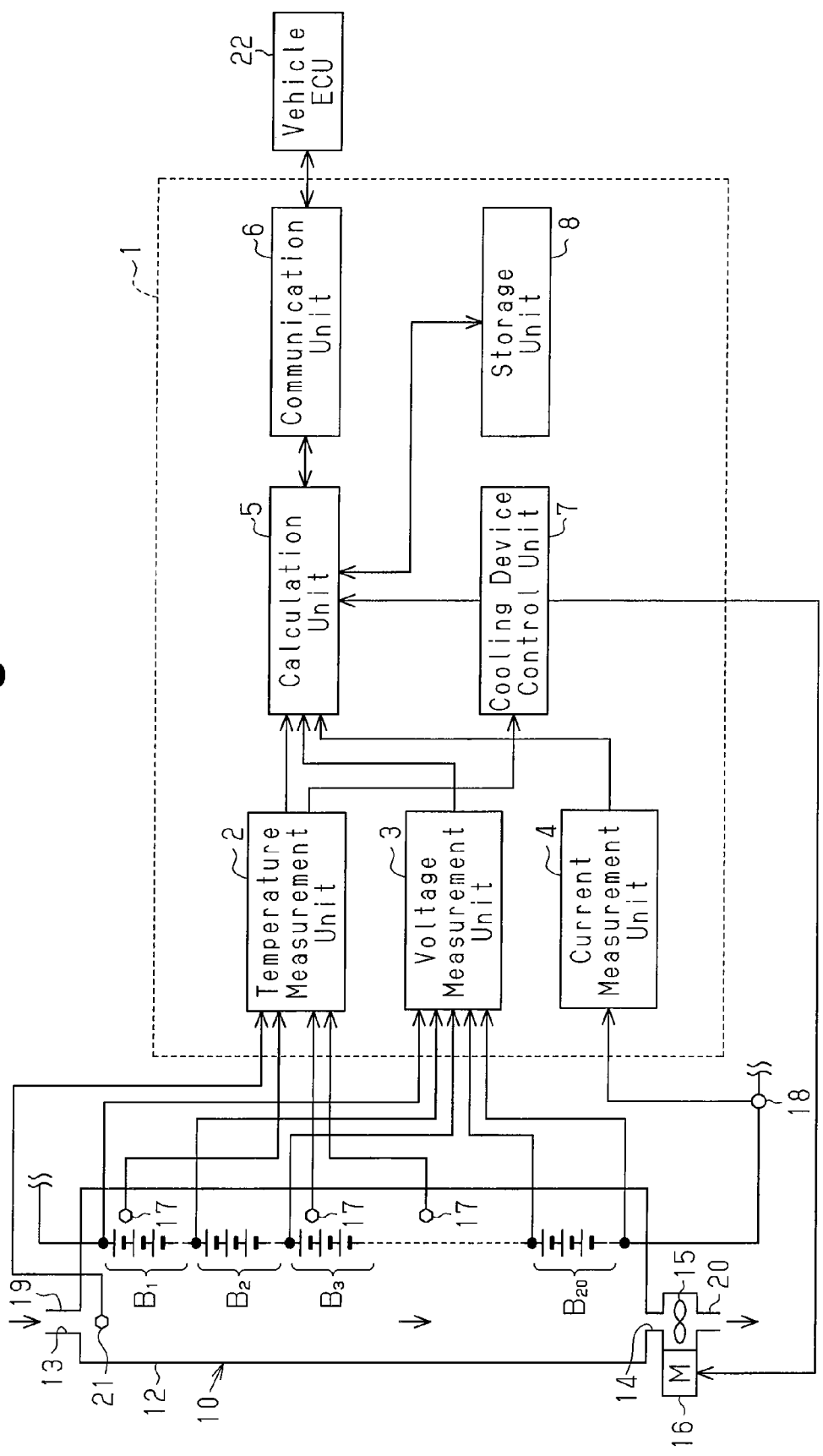
FIG. 1 is a schematic block diagram of a controller for a rechargeable battery according to a preferred embodiment of the present invention.

In the drawings, like numerals are used for like elements throughout.

One aspect of the present invention is a controller for a rechargeable battery. The controller includes a calculation unit which when operated calculates a heat generation amount of Joule heat generated in the rechargeable battery and a heat generation amount of chemical reaction heat generated in the rechargeable battery, and calculates a battery temperature of the rechargeable battery using a total heat amount of the Joule heat generation amount and the chemical reaction heat generation amount.

The controller further includes a current measurement unit, which measures current value of current when the rechargeable battery is being charged or discharged, and a storage unit. The calculation unit calculates the battery temperature and stores the battery temperature in the storage unit at predetermined time intervals, and calculates the chemical reaction heat amount using a latest battery temperature stored in the storage unit and the current value measured by the current measurement unit. This improves the accuracy for calculating the chemical reaction heat amount.

The controller further includes a current measurement unit which measures current value of current when the rechargeable battery is being charged or discharged. The calculation unit calculates a value of internal resistance of the rechargeable battery, and calculates the Joule heat generation amount using the calculated value of the internal resistance and the current value measured by the current measurement unit. In this case, the calculation unit detects an elapsed time from when direction of the current is switched in the rechargeable battery, corrects the value of the internal resistance in accordance with the detected elapsed time, and calculates the Joule heat generation amount using the corrected value of the internal resistance and the measured current value. This improves the accuracy for calculating the Joule heat generation amount.

The rechargeable battery has a cooling device connected thereto, and the cooling device has a predetermined cooling capability for cooling the rechargeable battery. The calculation unit calculates the battery temperature of the rechargeable battery using the Joule heat generation amount, the chemical reaction heat generation amount, and a value indicating the cooling capability of the cooling device. This enables the battery temperature of the rechargeable battery to be calculated taking into consideration the cooling capability of the cooling device.

The rechargeable battery has a temperature sensor connected thereto, and the temperature sensor measures temperature of the rechargeable battery. The calculation unit uses the total heat amount to calculate the battery temperature of the rechargeable battery as a first battery temperature, uses a signal provided from the temperature sensor to determine a second battery temperature of the rechargeable battery, and determines whether the rechargeable battery has deteriorated using the first battery temperature and the second battery temperature. This enables earlier recognition rechargeable battery deterioration in comparison to when determining determination from an increase in the internal resistance or a decrease in the terminal voltage.

The calculation unit corrects the total heat amount in accordance with the time required for the heat generated in the rechargeable battery to be conducted to the temperature sensor, and calculates the first battery temperature using the corrected total heat amount. This enables deterioration of the rechargeable battery to be determined with further accuracy.

The rechargeable battery is mounted on a vehicle including an internal combustion engine and a motor functioning as power sources, and the rechargeable battery supplies power to the motor.

Another aspect of the present invention is a method for estimating the temperature of a rechargeable battery. The method includes calculating a heat generation amount of Joule heat generated in the rechargeable battery, calculating a heat generation amount of chemical reaction heat generated in the rechargeable battery, and calculating a battery temperature of the rechargeable battery using the total heat amount of the Joule heat generation amount and the chemical reaction heat generation amount.

Said calculating a heat generation amount of Joule heat, said calculating a heat generation amount of chemical reaction heat, and said calculating a battery temperature of the rechargeable battery are performed at predetermined time intervals. The method further includes measuring current value of current when the rechargeable battery is being charged or discharged, and storing the calculated battery temperature in a storage unit at the predetermined time intervals. Said calculating a heat generation amount of chemical reaction heat includes calculating the chemical reaction heat amount using a latest battery temperature stored in the storage unit and the measured current value. This improves the accuracy for calculating the chemical reaction heat amount.

The method further includes measuring current value of current when the rechargeable battery is being charged or discharged. Said calculating a heat generation amount of Joule heat includes calculating a value of internal resistance of the rechargeable battery, and calculating the Joule heat generation amount using the calculated value of the internal resistance and the measured current value. Further, said calculating a heat generation amount of Joule heat includes detecting an elapsed time from when direction of the current is switched in the rechargeable battery, correcting the value of the internal resistance in accordance with the detected elapsed time, and calculating the Joule heat generation amount using the corrected value of the internal resistance and the measured current value. This improves the accuracy for calculating the Joule heat generation amount.

The rechargeable battery has a cooling device connected thereto, and the cooling device has a predetermined cooling capability for cooling the rechargeable battery. Said calculating a battery temperature of the rechargeable battery includes calculating the battery temperature of the rechargeable battery using the Joule heat generation amount, the chemical reaction heat generation amount, and a value indicating the cooling capability of the cooling device. This enables the battery temperature of the rechargeable battery to be calculated taking into consideration the cooling capability of the cooling device.

A further aspect of the present invention is a method for determining deterioration of a rechargeable battery. The method includes calculating a heat generation amount of Joule heat generated in the rechargeable battery, calculating a heat generation amount of chemical reaction heat generated in the rechargeable battery, calculating a first battery temperature of the rechargeable battery using the total heat amount of the Joule heat generation amount and the chemical reaction heat generation amount, determining a second battery temperature of the rechargeable battery based on a signal provided from a temperature sensor connected to the rechargeable battery, and determining whether the rechargeable battery has deteriorated using the first battery temperature and the second battery temperature. This enables thermal changes caused by an abnormality in the rechargeable battery to be detected with high sensitivity. This enables earlier recognition rechargeable battery deterioration in comparison to when determining determination from an increase in the internal resistance or a decrease in the terminal voltage.

Said calculating a first battery temperature includes correcting the total heat amount in accordance with the time required for the heat generated in the rechargeable battery to be conducted to the temperature sensor, and calculating the first battery temperature using the corrected total heat amount. This enables deterioration of the rechargeable battery to be determined with further accuracy.

The present invention may be a computer-readable product encoded with program instructions realizing the method for estimating the temperature of the rechargeable battery. The program is installed in a computer to execute the method for estimating the temperature of the rechargeable battery.

The present invention may be a computer-readable product encoded with program instructions realizing the method for determining deterioration of the rechargeable battery. The program is installed in a computer to execute the method for determining deterioration of the rechargeable battery.

A controller for a rechargeable battery 10, a method for estimating the temperature of the rechargeable battery 10, and a method for determining deterioration of the rechargeable battery 10 according to a preferred embodiment of the present invention will now be described with reference to FIGS. 1 to 7. First, the structure of the controller 1 for the rechargeable battery 10 will be described with reference to FIG. 1.

As shown in FIG. 1, the rechargeable battery controller (battery ECU) 1 of the preferred embodiment controls the rechargeable battery 10, which is mounted on an HEV (hybrid electric vehicle). The rechargeable battery 10 supplies power to a motor (not shown), which functions as a power source of the HEV, and a starter motor of an internal combustion engine mounted on the HEV in addition to each part of the HEV requiring power.

In the preferred embodiment, the rechargeable battery 10 is formed by connecting battery blocks $B_1$ to $B_{20}$ in series. The battery blocks $B_1$ to $B_{20}$ are accommodated in a battery case 12. Each of the battery blocks $B_1$ to $B_{20}$ is formed by electrically connecting two battery modules in series. Each battery module is formed by electrically connecting six cells 11 in series. Nickel-metal hydride batteries or lithium ion batteries may be used as the cells 11. The numbers of the battery blocks, the battery modules, and the cells 11 is not limited in any manner. The structure of the rechargeable battery 10 is not limited to the above-described structure.

A plurality of temperature sensors 17 are arranged in the battery case 12. The plurality of temperature sensors 17 are arranged so that each temperature sensor 17 is associated with either a battery block group of battery blocks having relatively close temperatures or a battery block group of battery blocks having relatively large temperature differences. The grouping of the battery blocks is based on the temperatures of the battery blocks measured in advance through experiments etc.

A cooling device is attached to the rechargeable battery 10. More specifically, the battery case 12 has an inlet 13 into which cooling air is drawn and an outlet 14 through which cooling air after heat exchange is discharged. The inlet 13 is in communication with the interior of the HEV via a cooling air introduction passage 19. The outlet 14 is in communication with the exterior of the vehicle via a cooling air discharge passage 20. A cooling fan 15 and a fan motor 16 for driving the cooling fan 15 are arranged on the cooling air discharge passage 20. In the preferred embodiment, the cooling fan 15 and the fan motor 16 form a cooling device.

In the preferred embodiment, the rechargeable battery controller 1 includes a temperature measurement unit 2, a voltage measurement unit 3, a current measurement unit 4, a calculation unit 5, a communication unit 6, a cooling device control unit 7, and a storage unit 8.

The temperature measurement unit 2 measures the actual battery temperature of the rechargeable battery 10 with the temperature sensors 17. In the preferred embodiment, the temperature measurement unit 2 converts an analog signal, which is provided from the temperature sensor 17 of each battery block group in the battery case 12, to a digital signal. The temperature measurement unit 2 then generates temperature data specifying the battery temperature of each battery block group based on the digital signal and provides the temperature data to the calculation unit 5. The calculation unit 5 stores the temperature data in the storage unit 8. The temperature data is also provided from the temperature measurement unit 2 to the calculation unit 5 in preset cycles. The temperature data is used in a rechargeable battery deterioration determination process, which will be described later.

In the preferred embodiment, another temperature sensor 21 is arranged near the inlet 13 of the battery case 12. The temperature measurement unit 2 further measures the cooling air temperature $T_{amb}$ based on a signal provided from the temperature sensor 21 and provides temperature data specifying the cooling air temperature $T_{amb}$ to the calculation unit 5.

The voltage measurement unit 3 measures terminal voltage of the rechargeable battery 10. In the preferred embodiment, the voltage measurement unit 3 measures terminal voltages $Vu_1$ to $Vu_{20}$ of the battery blocks $B_1$ to $B_{20}$. Further, the voltage measurement unit 3 generates voltage data specifying the terminal voltages $Vu_1$ to $Vu_{20}$ of the battery blocks and provides the voltage data to the calculation unit 5. The calculation unit 5 stores the voltage data in the storage unit 8. The voltage data is provided from the voltage measurement unit 3 to the calculation unit 5 in preset cycles.

The current measurement unit 4 measures the current value of the current of the rechargeable battery 10 when the rechargeable battery 10 is charged or discharged based on a signal provided from a current sensor 18. In the preferred embodiment, the current measurement unit 4 converts an analog signal provided from the current sensor 18 to a digital signal. Based on the digital signal, the current measurement unit 4 generates current data specifying the current value of the current input into the rechargeable battery 10 when the rechargeable battery 10 is charged and current data specifying the current value of the current output from the rechargeable battery 10 when the rechargeable battery 10 is discharged. The current measurement unit 4 provides the generated current data to the calculation unit 5.

Further, the current measurement unit 4 generates current data indicating a negative value when the rechargeable battery 10 is charged and generates current data indicating a positive value when the rechargeable battery 10 is discharged. The current measurement unit 4 also provides the current data to the calculation unit 5 in preset cycles. The calculation unit 5 stores the current data in the storage unit 8. Hereafter, the current values specified by the current data are referred to as values $I_1, I_2, \ldots, I_{m-1}$, and $I_m$ (where m is an integer) in the order in which the values are provided from the current measurement unit 4 to the calculation unit 5.

The cooling device control unit 7 prevents the battery temperature of the rechargeable battery 10 from exceeding a predetermined value. The cooling device control unit 7 switches the voltage applied to the fan motor 16 between multiple voltage levels and adjusts the fan speed of the cooling fan 15 in steps. More specifically, the cooling device control unit 7 determines whether the present fan speed of the cooling fan 15 is appropriate with respect to the actual battery temperature measured by the temperature measurement unit 2 with the temperature sensors 17. When the fan speed is not appropriate, the cooling device control unit 7 selects an appropriate fan speed and adjusts the voltage applied to the fan motor 16 to operate the cooling fan 15 at the selected fan speed.

The cooling device control unit 7 may also adjust the fan speed of the cooling fan 15 based on the battery temperature estimated by the calculation unit 5, which will be described later, or based on both the actual battery temperature measured by the temperature measurement unit 2 using the temperature sensors 17 and the battery temperature estimated by the calculation unit 5. Further, the cooling device control unit 7 transmits information of the present fan speed to the calculation unit 5.

The calculation unit 5 calculates a heat generation amount of Joule heat generated in the rechargeable battery 10 (Joule heat $HG_{joule}$) and a heat generation amount of chemical reaction heat generated in the rechargeable battery 10 (chemical reaction heat $HG_{chem}$). Based on these heat generation amounts, the calculation unit 5 calculates (estimates) the battery temperature of the rechargeable battery 10. Hereafter, the battery temperature estimated by the calculation unit 5 is referred to as "estimated battery temperature". In the preferred embodiment, the calculation unit 5 determines whether the rechargeable battery 10 has deteriorated based on both the estimated battery temperature and the actual battery temperature measured using the temperature sensors 17. The deterioration determination process will be described in detail later with reference to FIG. 8.

In the preferred embodiment, the calculation unit 5 further calculates the estimated battery temperature and stores the calculated estimated battery temperature in the storage unit 8 at predetermined time intervals. Hereafter, the estimated battery temperatures are referred to as temperatures $T_1$, $T_2$, etc. to $T_{m-1}$ and $T_m$ (where m is an integer) in the order in which the temperatures are calculated.

In the preferred embodiment, the cooling device is attached to the rechargeable battery 10. Thus, the calculation unit 5 calculates the battery temperature of the rechargeable battery 10 based on the Joule heat $HG_{joule}$, the chemical reaction heat $HG_{chem}$, and the cooling capability of the cooling device.

More specifically, the calculation unit 5 first adds the chemical reaction heat $HG_{chem}$ to the Joule heat $HG_{joule}$ to obtain the sum of these heat amounts, that is, a total heat amount of the rechargeable battery 10. To compare the estimated battery temperature with the actual battery temperature in the deterioration determination process, the calculation unit 5 corrects the total heat amount of the rechargeable battery 10 in accordance with the time required for the heat generated in the rechargeable battery 10 to be conducted to the temperature sensors 17. Next, the calculation unit 5 subtracts a cooled heat amount, which is the amount of heat removed from the rechargeable battery 10 by the cooling device, from the corrected total heat amount. The calculation unit 5 then calculates the estimated battery temperature based on the heat amount resulting from the subtraction. The process for calculating the estimated battery temperature will be described in more detail later with reference to FIG. 4.

In the preferred embodiment, the calculation unit 5 calculates the chemical reaction heat $HG_{chem}$ based on the last estimated battery temperature stored in the storage unit 8 and the current value measured by the current measurement unit 4. More specifically, the calculation unit 5 calculates the latest chemical reaction heat $HG_{chem}$ using the previously calculated estimated battery temperature $T_{m-1}$ and the latest current value $I_m$. The calculation unit 5 then calculates the latest estimated battery temperature $T_m$ using the calculated latest chemical reaction heat $HG_{chem}$. The process for calculating the chemical reaction heat $HG_{chem}$ will be described in more detail later with reference to FIG. 6. When the estimated battery temperature is first calculated, there is no previous battery temperature. Thus, the actual battery temperature measured by the temperature measurement unit 2 is used instead of the previous estimated battery temperature in the preferred embodiment.

Further, in the preferred embodiment, the calculation unit 5 calculates the value of the internal resistance of the rechargeable battery 10 and calculates the Joule heat $HG_{joule}$ based on the calculated value of the internal resistance and the current value measured by the current measurement unit. The internal resistance of the rechargeable battery 10 changes when the direction of the current of the rechargeable battery 10 is switched. The internal resistance of the rechargeable battery 10 also changes as time elapses even when the current direction is unchanged. In the preferred embodiment, the calculation unit 5 detects the elapsed time from when the direction of the current of the rechargeable battery 10 is switched and corrects the internal resistance in accordance with the detected elapsed time. The calculation unit 5 calculates the Joule heat $HG_{joule}$ using the corrected value of the internal resistance.

The time elapsed from when the direction of the current of the rechargeable battery is switched is not limited to the time elapsed from when the state of the rechargeable battery is switched from the charging state to the discharging state or from the discharging state to the charging state. This includes the time elapsed from when the discharging or the charging of the rechargeable battery is started.

Figure 2:
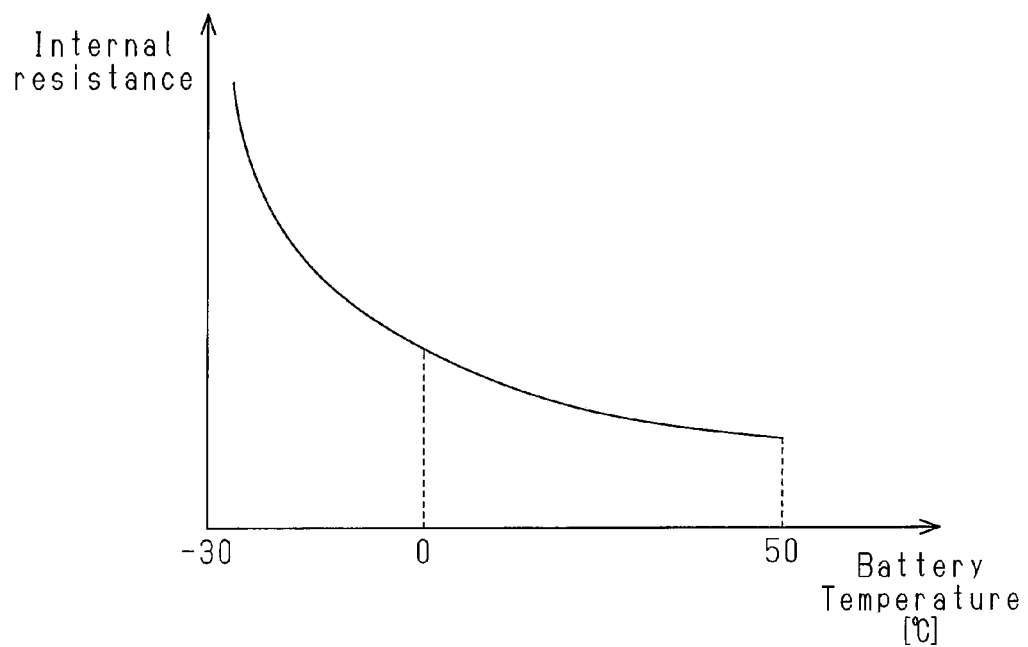
FIG. 2 is a graph schematically showing the relationship between the battery temperature and the internal resistance of the rechargeable battery shown in FIG. 1.
Figure 3:
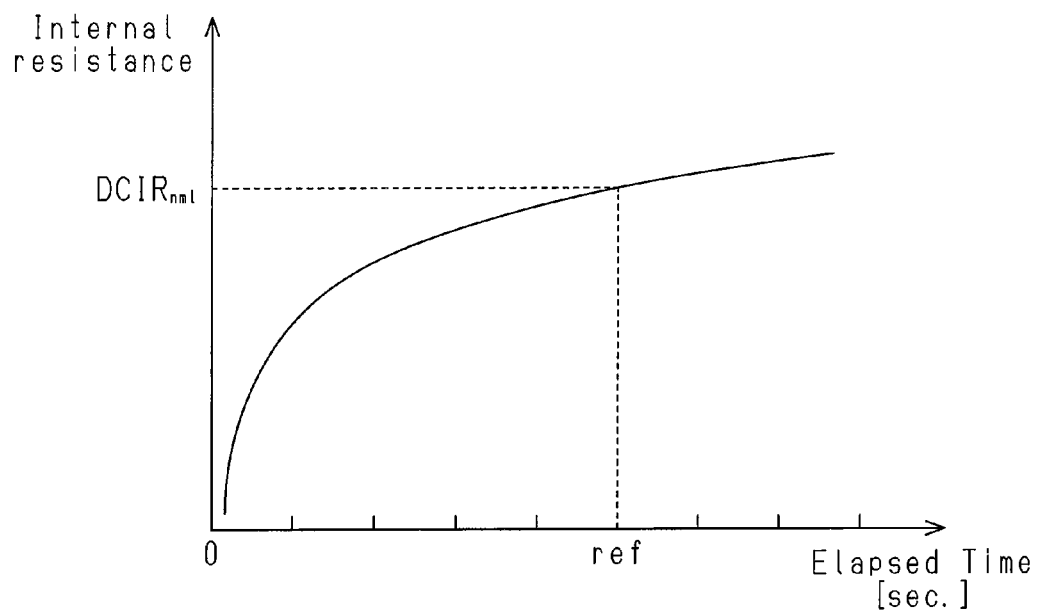
FIG. 3 is a graph schematically showing the relationship between the elapsed time from when the current direction of the rechargeable battery shown in FIG. 1 is changed and the internal resistance of the rechargeable battery.

The calculation of the internal resistance of the rechargeable battery 10 and the correction of the internal resistance in accordance with the elapsed time will be described with reference to FIGS. 2 and 3. FIG. 2 shows the relationship between the battery temperature and the internal resistance of the rechargeable battery. FIG. 3 shows the relationship between the elapsed time and the internal resistance of the rechargeable battery.

As shown in FIG. 2, the internal resistance changes in accordance with the battery temperature. Further, the internal resistance has a constant relation with the battery temperature. As shown in FIG. 3, the internal resistance also changes in accordance with the elapsed time from when the direction of the current of the rechargeable battery is switched. The internal resistance also has a constant relation with the elapsed time. Thus, the internal resistance of the rechargeable battery 10 needs to be calculated based on both the battery temperature and the elapsed time.

In the preferred embodiment, a map showing the relationship between the battery temperature and the internal resistance (battery temperature—internal resistance map) and a map showing the relationship between the elapsed time and the internal resistance (elapsed time—internal resistance map) are generated in advance through discharging experiments. To provide consistency between the two maps, the battery temperature—internal resistance map is generated based on values of the internal resistance measured when the elapsed time from the start of the discharging reaches a reference time ref (e.g. five seconds) (refer to FIG. 3). The storage unit 8 stores the two generated maps.

More specifically, when the calculation unit 5 calculates the latest battery temperature Tm, the calculation unit 5 first applies the previously calculated estimated battery temperature (previous estimated battery temperature) $T_{m-1}$ to the battery temperature—internal resistance map, and specifies the internal resistance $DCIR_{nm1}$ corresponding to the battery temperature $T_{m-1}$ at the reference time ref. The calculation unit 5 then detects the elapsed time count, applies the detected elapsed time count and the reference time ref to the elapsed time—internal resistance map, and specifies the internal resistance f(count) corresponding to the elapsed time count and the internal resistance f(ref) corresponding to the reference time ref.

The calculation unit 5 obtains the product of the internal resistance $DCIR_{nm1}$ and the ratio of the internal resistance f(count) and the internal resistance f(ref) (f(count)/f(ref)) to correct the internal resistance $DCIR_{nm1}$. The corrected internal resistance DCIR is used to calculate the Joule heat $HG_{joule}$. The process for calculating the internal resistance of the rechargeable battery 10, the process for correcting the internal resistance according to the elapsed time, and the process for calculating the Joule heat $HG_{joule}$ will be described in more detail later with reference to FIG. 5.

In the preferred embodiment, the calculation unit 5 further uses the estimated battery temperature to estimate the charging state (hereafter referred to as SOC (state of charge)) of the rechargeable battery or to set the maximum value of the discharging amount output by the rechargeable battery 10 in a predetermined period of time.

The communication unit 6 transmits and receives information to and from a vehicle ECU 22, which is mounted on the vehicle (HEV). For example, the communication unit 6 provides the output maximum value of the discharging amount set by the calculation unit 5 or the SOC estimated by the calculation unit 5 to the vehicle ECU 22. Further, the communication unit 6 receives a signal from the vehicle ECU 22, for example, a signal indicating that the ignition of the vehicle is turned on or off and provides the received signal to the calculation unit 5.

The vehicle ECU 22 shown in FIG. 1 controls the motor, the engine, an air conditioner, and various measuring instruments of the vehicle (HEV). The vehicle ECU 22 drives the motor in accordance with the output maximum value set by the battery ECU 1 or the SOC estimated by the battery ECU 1.

The method for estimating the temperature of the rechargeable battery 10 according to the preferred embodiment will now be described with reference to FIGS. 4 to 7.

FIG. 4 is a flowchart showing the temperature estimation method for the rechargeable battery 10 in the preferred embodiment. The temperature estimation method for the rechargeable battery 10 of the preferred embodiment is implemented by operating the controller 1 for the rechargeable battery 10 shown in FIG. 1. Thus, the temperature estimation method will hereafter be described based on the operation of the controller (battery ECU) 1 for the rechargeable battery 10 shown in FIG. 1.

The temperature estimation process shown in FIG. 4 is performed in predetermined time intervals. In the preferred embodiment, the predetermined time is set to one second. The estimated battery temperatures $T_1, T_2, \ldots, T_{m-1}$ [° C.] are calculated before the temperature estimation process shown in FIG. 4 is started. The storage unit 8 stores the estimated battery temperatures $T_1, T_2, \ldots, T_{m-1}$. The process shown in FIG. 4 may be performed in time intervals other than one second.

As shown in FIG. 4, the calculation unit 5 accesses the storage unit 8 and acquires the battery temperature calculated in the previous cycle of this process (previous estimated battery temperature) $T_{m-1}$ (step S1) Next, the calculation unit 5 calculates the Joule heat $HG_{joule}$ [J] of the rechargeable battery 10 (step S2), and then calculates the chemical reaction heat $HG_{chem}$ [J] of the rechargeable battery 10 (step S3). The calculation of the joule heat $HG_{joule}$ performed in step S2 will be described in more detail with reference to FIG. 5. The calculation of the chemical reaction heat $HG_{chem}$ performed in step S3 will be described in more detail with reference to FIG. 6.

Next, the calculation unit 5 substitutes the Joule Heat $HG_{joule}$ calculated in step S2 and the chemical reaction heat $HG_{chem}$ calculated in step S3 in equation 1 shown below to calculate the total heat amount $W_0$ [J] of the rechargeable battery 10 (step S4).

Equation 1

$$W_0 = HG_{joule} + HG_{chem} \quad (1)$$

The total heat amount $W_0$ is calculated in step S4 without considering the time required by the heat generated in the rechargeable battery 10 to be conducted to the temperature sensors 17. Thus, the total heat amount $W_0$ needs to be corrected in accordance with the time required by such heat conduction. The calculation unit 2 calculates the total heat amount W [J] by performing a primary delay processing using equation 2 shown below (step S5). In equation 2 shown below, W is the corrected total heat amount of the rechargeable battery 10 and $\Delta t$ is the predetermined time described above. In equation 2, $\alpha$ is the time constant determined by the arrangement positions of the temperature sensors 17 and the structure and the material of the rechargeable battery 10.

Equation 2

$$W = W_0(1 - e^{-\Delta t/\alpha}) \quad (2)$$

The position of the heat generation part of the battery (heat generation location of the battery) and the position of the temperature detection part (temperature sensors) on the battery surface are fixed. Thermal diffusion between the two fixed points is expressed using equation 3 shown below in accordance with the Fick's first law. In equation 3 shown below, J is the diffusion flux [J/m²·s], C is the concentration of the heat amount [J/m³], a is the diffusivity [m²/s], and x is the distance [m] between the heat generation part and the temperature detection part.

Equation 3

$$J = -a \cdot \frac{dC}{dx} \quad (3)$$

The diffusivity a used in equation 3 above is expressed using equation 4 shown below. In equation 4 shown below, $\lambda$ is the conductivity [J/mKs], Cp is the heat capacity [J/kgK], and p is the density [kg/m³].

Equation 4

$$a = \frac{\lambda}{Cp \cdot \rho} \quad (4)$$

The conductivity, the heat capacity, and the density of the components of the battery (the positive pole, the negative pole, the separator, the electrolyte, and the battery case 12) are unchanged when the battery has not deteriorated. Thus, the diffusivity a expressed using equation 4 shown above is fixed. When the concentration gradient of the heat amount (dC/dx) is simply assumed to be fixed, the diffusion flux J is also assumed to be fixed. As a result, the total heat amount W based on the heat conduction time is replaceable by the primary delay transfer function of the time constant α. The time constant α is obtained in advance through discharging experiments. In a strict sense, the concentration gradient of the heat amount (dC/dx) changes in accordance with the heat generation amount of the heat generation part of the battery. Thus, it is preferable to set the time constant α according to the heat generation amount.

Next, to calculate the cooled heat amount U, which is the amount of heat removed from the rechargeable battery 10 by the cooling device, the calculation unit 5 acquires the temperature in the vicinity of the inlet 13 of the battery case 12 (cooling air temperature $T_{amb}$ [° C.]) based on the temperature data provided from the temperature measurement unit 2 (step S6).

The calculation unit 5 calculates the cooling capability of the cooling device (heat capacity Kf [J/K] of the cooling air drawn into the battery case 12) (step S7). The amount of the cooling air drawn into the battery case 12 has a constant relation with the heat capacity Kf and is proportional to the fan speed. Thus, the heat capacity Kf corresponding to each fan speed is calculated in advance through experiments in the preferred embodiment. The storage unit 8 stores a map (fan speed—heat capacity map) for specifying the heat capacity Kf corresponding to each fan speed. The calculation unit 5 receives the present fan speed from the cooling device control unit 7 and applies the present fan speed to the fan speed—heat capacity map to specify the heat capacity Kf corresponding to the present fan speed.

Next, the calculation unit 5 calculates the cooled heat amount U [J], which is the amount of heat removed from the rechargeable battery 10 by the cooling device (step S8). More specifically, the calculation unit 5 substitutes the previous estimated battery temperature $T_{m-1}$ obtained in step S1, the cooling air temperature $T_{amb}$ obtained in step S6, and the heat capacity Kf of the cooling air calculated in step S7 to equation 5 shown below to obtain the cooled heat amount U.

Equation 5

$$U = Kf(T_{m-1} - T_{amb}) \quad (5)$$

Afterwards, the calculation unit 5 calculates the estimated battery temperature Tm (step S9), and stores the calculated estimated battery temperature Tm [° C.] in the storage unit 8 (step S10). The calculation unit 5 then terminates the temperature estimation process. More specifically, the calculation unit 5 substitutes the previous estimated battery temperature $T_{m-1}$ obtained in step S1, the total heat amount W calculated in step S5, and the cooled heat amount U calculated in step S8 to equation 6 shown below. In equation 6 shown below, M is the heat capacity [J/K] per cell 11. In the next cycle of this process, the estimated battery temperature $T_m$ calculated in this cycle is used as the previous battery temperature $T_{m-1}$.

Equation 6

$$T_m = T_{m-1} + \Delta t(W-U)/M \quad (6)$$

Figure 5:
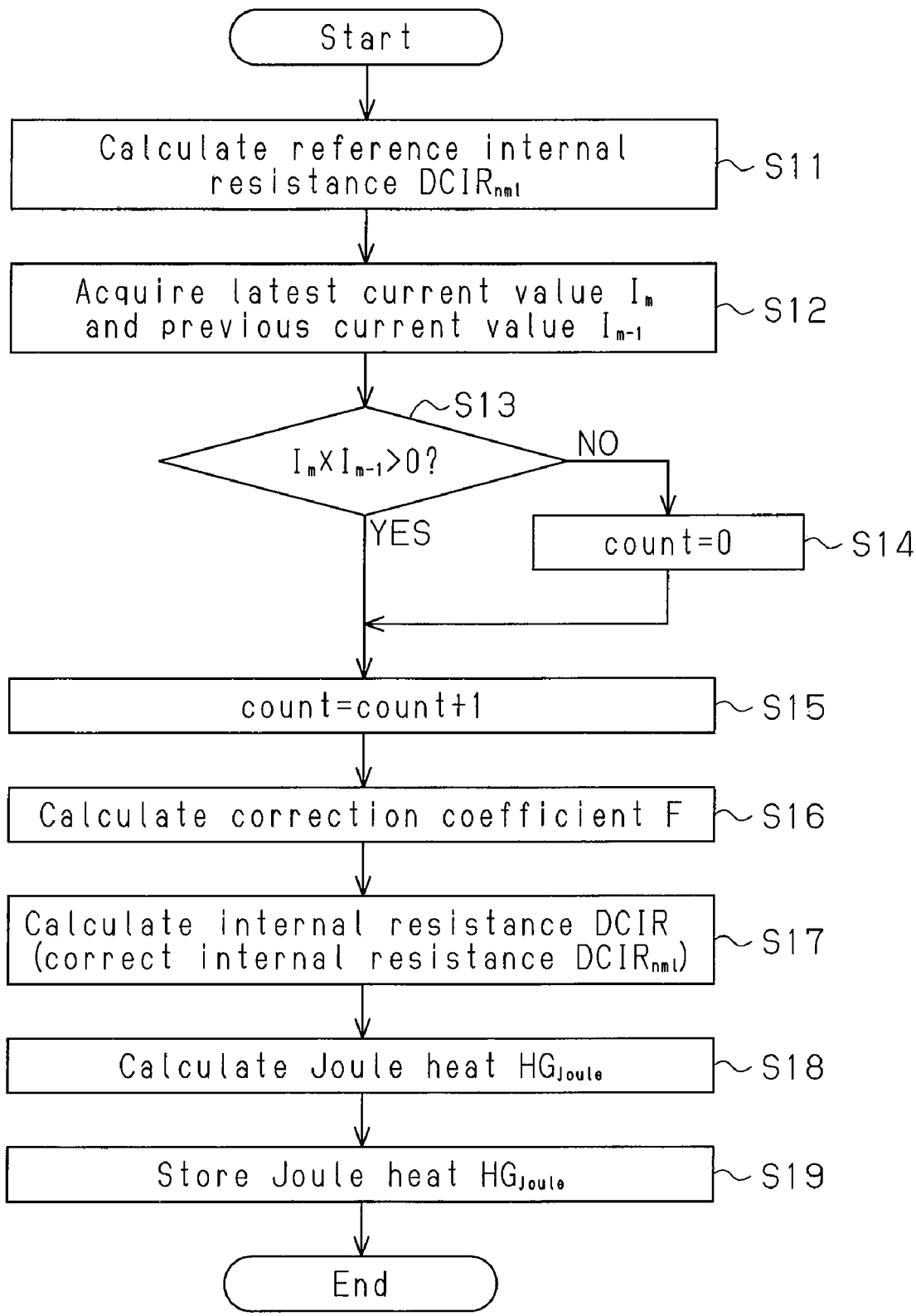
FIG. 5 is a flowchart schematically showing a process for calculating Joule heat generated in the rechargeable battery shown in FIG. 4.

The process for calculating the Joule heat $HG_{joule}$ in step S2 in FIG. 4 will be described with reference to FIG. 5. FIG. 5 is a flowchart showing the process for calculating the Joule heat generated in the rechargeable battery.

As shown in FIG. 5, the calculation unit 5 first calculates the reference internal resistance $DCIR_{nm1}$ of the rechargeable battery 10 (step S11). More specifically, the calculation unit 5 applies the previous estimated battery temperature $T_{m-1}$ obtained in step S2 shown in FIG. 4 to the battery temperature—internal resistance map and specifies the internal resistance $DCIR_{nm1}$ as described above. As described above, the internal resistance $DCIR_{nm1}$ specified here is the internal resistance of the rechargeable battery 10 at the reference time ref.

Next, the calculation unit 5 determines whether the direction of the current of the rechargeable battery 10 has been switched (step S13). More specifically, the calculation unit 5 acquires the latest current value $I_m$ and the previous current value $I_{m-1}$ from the current data provided from the current measurement unit 4 (step S12), obtains the product of the two current values ($I_m*I_{m-1}$), and determines whether the obtained product ($I_m*I_{m-1}$) is greater than zero.

When the product ($I_m*I_{m-1}$) is greater than zero, the current direction has not been switched. In this case, the calculation unit 5 performs the processing in step S15 and adds one to the value of the elapsed time count from when the direction of the current of the rechargeable battery is switched. When the product ($I_m*I_{m-1}$) is equal to or less than zero, the current direction has been switched. In this case, the calculation unit 5 sets the value of the elapsed time count to zero (step S14), and then performs the processing in step S15. In the preferred embodiment, the calculation unit 5 detects the timing at which the current direction is switched based on the product of the latest current value and the previous current value ($I_m*I_{m-1}$)

In the preferred embodiment, the storage unit 8 stores the parameter count. The calculation unit 5 adds one to the value of the parameter count in step S15. Further, the calculation unit 4 sets the value of the parameter count to zero in step S14. In the preferred embodiment, the temperature estimation process shown in FIG. 4 is performed at intervals of one second. Thus, the elapsed time count (second) is specified using the value of the parameter count.

After step S15, the calculation unit 5 calculates the correction coefficient F for correcting the internal resistance $DCIR_{nm1}$ calculated in step S11 according to the elapsed time count (step S16). More specifically, the calculation unit 5 applies the elapsed time count and the reference time ref to the elapsed time—internal resistance map described above and specifies the internal resistance f(count) corresponding to the elapsed time count and the internal resistance f(ref) corresponding to the reference time ref. Further, the calculation unit 5 obtains, as the correction coefficient F, the ratio of the internal resistance f(count) and the internal resistance f(ref) using equation 7 shown below.

Equation 7

$$F = f(\text{count})/f(\text{ref}) \quad (7)$$

The calculation unit 5 corrects the internal resistance $DCIR_{nm1}$ calculated in step S11 using the correction coefficient F calculated in step S16 (step S17). More specifically, the calculation unit 5 substitutes the correction coefficient F calculated in step S16 and the internal resistance $DCIR_{nm1}$ calculated in step S11 in equation 8 shown below to calculate the corrected internal resistance DCIR.

Equation 8

$$DCIR = DCIR_{nm1} \times F \quad (8)$$

The calculation unit 5 calculates the Joule heat $HG_{joule}$ using the internal resistance DCIR calculated in step S17 (step S18) and stores the calculated Joule heat $HG_{joule}$ in the storage unit 8 (step S19). More specifically, the calculation unit 5 substitutes the internal resistance DCIR calculated in step S17 and the latest current value Im in equation 9 shown below to calculate the Joule heat $HG_{joule}$. The Joule heat $HG_{joule}$ calculated through the processing in steps S11 to S19 is used in the temperature estimation process shown in FIG. 4 (in step S2).

Equation 9

$$HG_{joule} = DCIR \times I_m^2 \quad (9)$$

Figure 6:
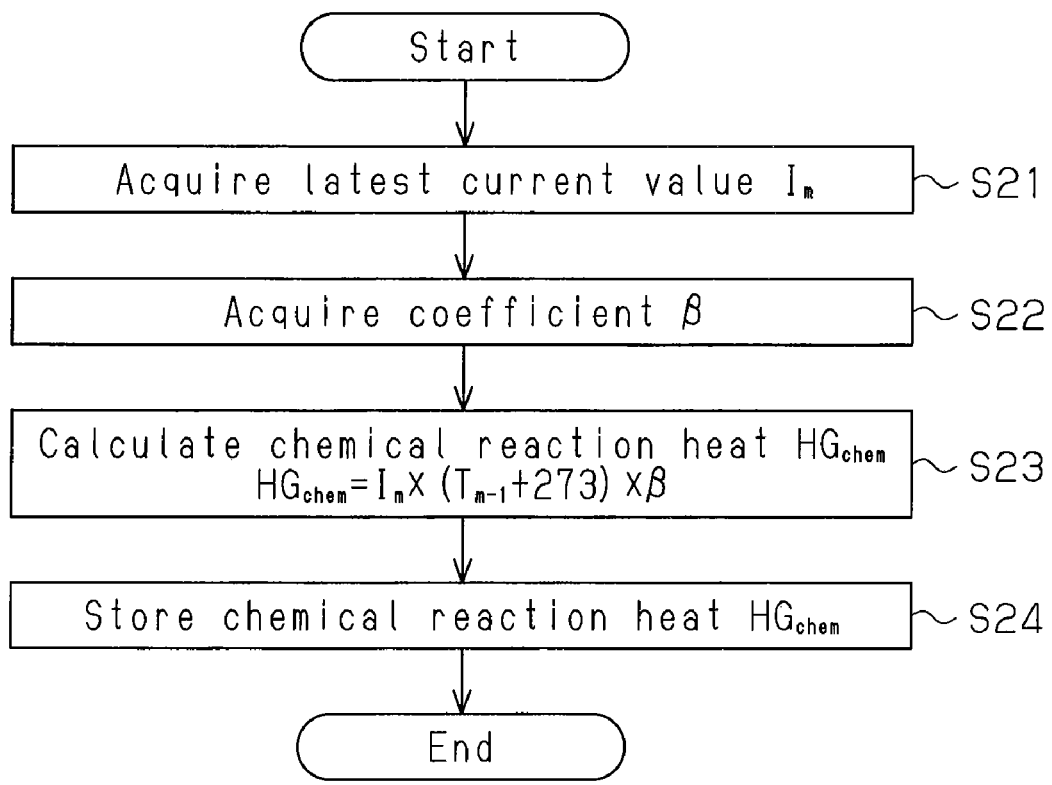
FIG. 6 is a flowchart schematically showing a process for calculating chemical reaction heat generated in the rechargeable battery shown in FIG. 5.

The process for calculating the chemical reaction heat $HG_{chem}$ shown in step S3 in FIG. 4 will now be described with reference to FIG. 6. FIG. 6 is a flowchart showing the process for calculating the chemical reaction heat of the rechargeable battery 10.

As shown in FIG. 6, the calculation unit 5 first extracts the latest current value Im from the current data provided from the current measurement unit 4 (step S21). Next, the calculation unit 5 acquires the coefficient β, which is used in step S23 described later (step S22). The coefficient β is prestored in the storage unit 8.

Next, the calculation unit 5 calculates the chemical reaction heat $HG_{chem}$ [J] using the current value $I_m$ obtained in step S21, the coefficient β obtained in step S22, and the pervious estimated battery temperature $T_{m-1}$ [° C.] obtained in step S1 shown in FIG. 4 (step S23). The calculation unit 5 stores the calculated chemical reaction heat $HG_{chem}$ [J] in the storage unit 8 (step S24). More specifically, the calculation unit 5 substitutes the current value Im, the coefficient β, and the previous estimated battery temperature $T_{m-1}$ in equation 10 shown below and obtains the chemical reaction heat $HG_{chem}$. The chemical reaction heat $HG_{chem}$ calculated through the processing in steps S21 to S24 is used in the temperature estimation process shown in FIG. 4 (in step S3).

Equation 10

$$HG_{chem} = I_m \times (T_{m-1} + 273) \times \beta \quad (10)$$

The coefficient β will now be described. Equation 11 shown below is derived from a normal equation in electrochemistry. In equation 11 shown below, G is the free energy [J] of the battery, H is the chemical reaction heat [J] of the battery, T is the temperature [K] of the battery, and S is the entropy [J/K] of the battery.

Equation 11

$$\Delta G = \Delta H - T\Delta S \quad (11)$$

In systems in which spontaneous energy releases do not occur, ΔG=0 is satisfied. Thus, equation 11 above is transformed into equation 12 shown below.

Equation 12

$$\Delta H = T\Delta S \quad (12)$$

The entropy S of the battery is expressed using equation 13 shown below. In equation 13 shown below, P is the internal pressure [N/m²] of the battery and E is the voltage [V] of the battery.

Equation 13

$$\Delta S = -\left[\frac{d(\Delta G)}{dT}\right]_P = -nF\left(\frac{\delta E}{\delta T}\right)_P \quad (13)$$

The chemical reaction heat $HG_{chem}$ is expressed using equation 14 shown below. In equation 14 shown below, n is the reaction electron number and F is the Faraday constant [C]. For example, when the cell 11 is a nickel-metal hydride battery, n=1 is satisfied.

Equation 14

$$HG_{chem} = \Delta H\left(\frac{I}{nF}\right) \quad (14)$$

Further, equation 14 above is transformed into equation 15 shown below using equations 12 and 13 above.

Equation 15

$$HG_{chem} = -nFT\left(\frac{\delta E}{\delta T}\right)_P\left(\frac{I}{nF}\right) = -IT\left(\frac{\delta E}{\delta T}\right)_P \quad (15)$$

Based on equations 15 and 10 above, $\beta = -(\delta E/\delta T)_P$ is satisfied. The term $-(\delta E/\delta T)_P$ has a unique value that is determined by the structure or type of the rechargeable battery 10. The coefficient β is obtained in advance through experiments.

Figure 7:
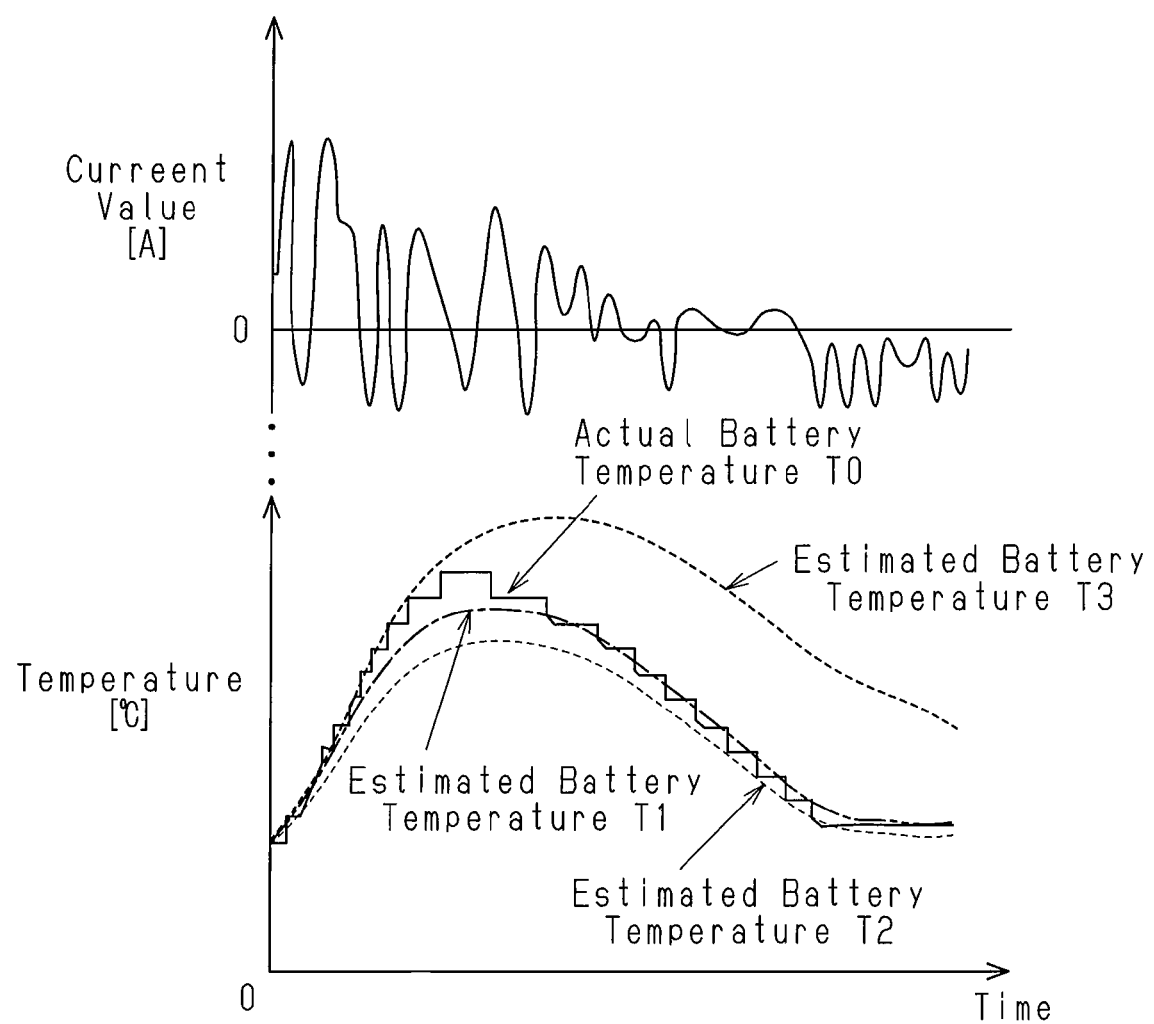
FIG. 7 is a graph showing a difference between the estimated battery temperature calculated with the method shown in FIG. 4 and the actual battery temperature.

Next, the difference between the estimated battery temperature calculated using the temperature estimation method of the rechargeable battery 10 according to the preferred embodiment and the actual battery temperature measured using the temperature sensors 17 will be described with reference to FIG. 7. FIG. 7 is a graph showing the difference between the estimated battery temperature and the actual battery temperature. FIG. 7 also shows current values of the rechargeable battery 10 corresponding to battery temperatures. In FIG. 7, the vertical axis represents battery temperature and current value, and the horizontal axis represents time.

FIG. 7 shows the actual battery temperature (T0) measured using the temperature sensors 17, the estimated battery temperature (T1) calculated based on the Joule heat (with the internal resistance value being corrected) and the chemical reaction heat, the estimated battery temperature (T2) calculated using the Joule heat (without the internal resistance value being corrected) and the chemical reaction heat, and the estimated battery (T3) calculated based on only the Joule heat. In FIG. 7, the actual battery temperature (T0) is the battery temperature measured by the temperature sensor 17 arranged in the middle of the battery case 12 (refer to FIG. 1).

As shown in FIG. 7, the estimated battery temperatures (T1) and (T2) calculated based on the Joule heat and the chemical reaction heat are approximate to the actual battery temperature (T0). In contrast, the estimated battery temperature (T3) calculated based on only the Joule heat like in the prior art deviates greatly from the actual battery temperature (T0) as compared with the estimated battery temperatures (T1) and (T2). This tendency becomes more prominent as time elapses. As shown in FIG. 7, the estimated battery temperature (T1) using the Joule heat calculated based on the corrected internal resistance value (refer to step S17 in FIG. 5) deviates by a smaller amount from the actual battery temperature (T0).

As described above, the controller 1 for the rechargeable battery 10 and the temperature estimation method for the rechargeable battery 10 according to the preferred embodiment enable an accurate battery temperature to be obtained through calculation. Further, the controller 1 and the method of the preferred embodiment enable an accurate battery temperature to be obtained without requiring highly accurate temperature sensors to be used. This enables cost reductions.

Figure 8:
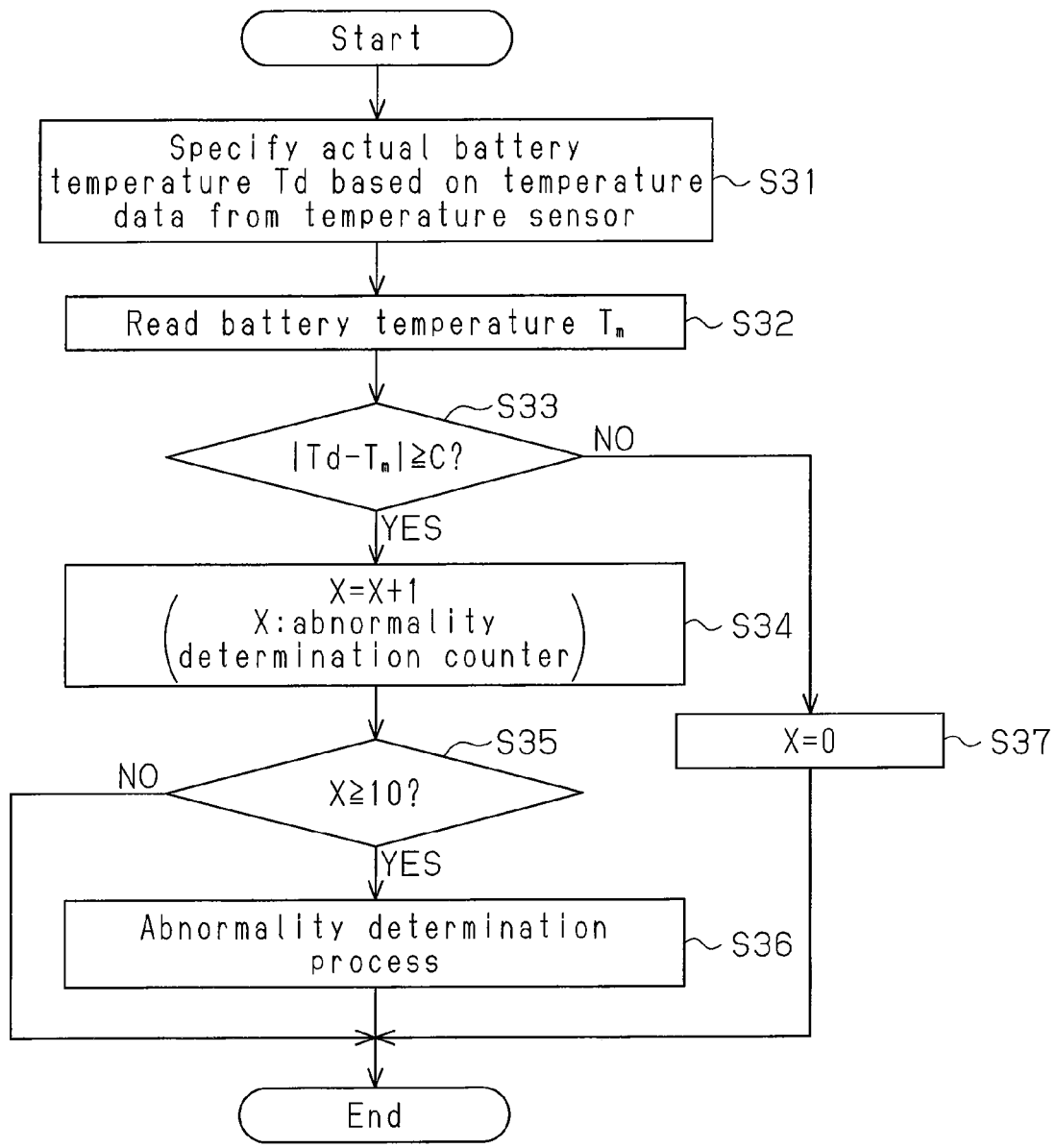
FIG. 8 is a flowchart showing a deterioration determination method for a rechargeable battery in the preferred embodiment.
Figure 9:
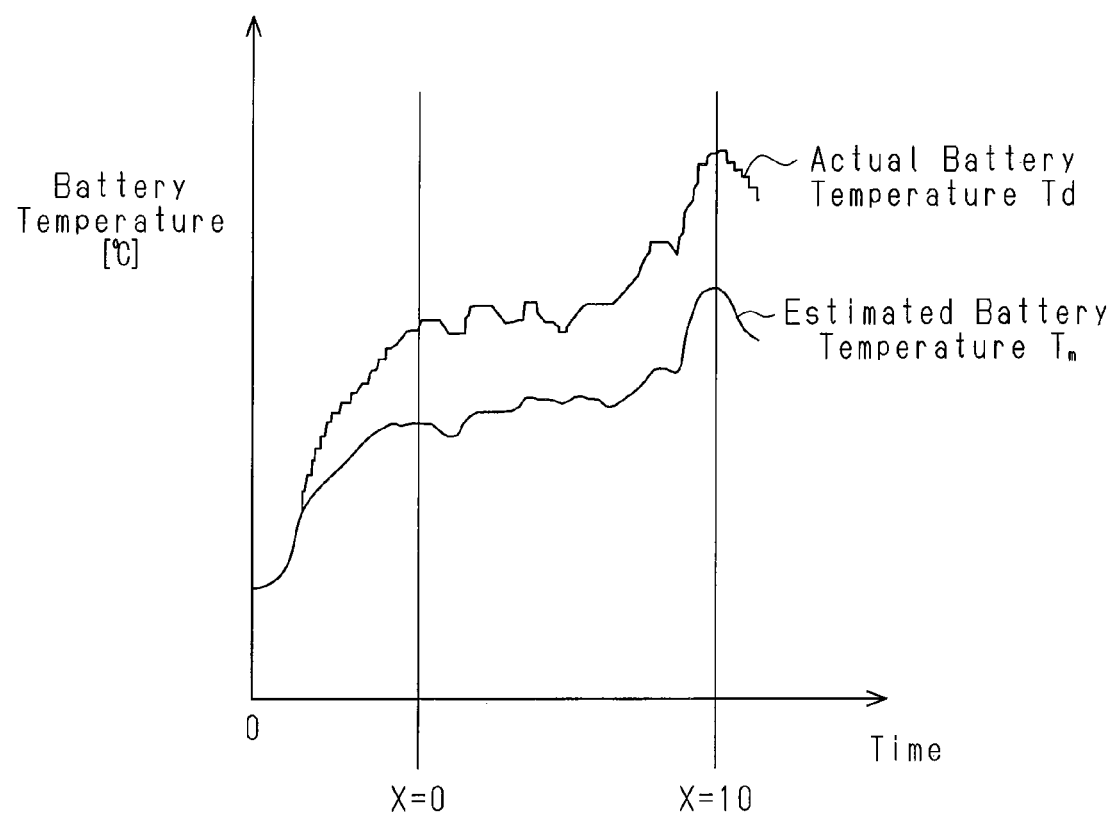
FIG. 9 is a graph showing the estimated battery temperature and the actual battery temperature when the rechargeable battery is determined as having deteriorated with the deterioration determination method shown in FIG. 8.

The method for determining whether the rechargeable battery 10 has deteriorated in the preferred embodiment will now be described with reference to FIGS. 8 and 9. FIG. 8 is a flowchart showing the deterioration determination method for the rechargeable battery 10 in the preferred embodiment. FIG. 9 is a graph showing the estimated battery temperature and the actual battery temperature when the rechargeable battery 10 is determined as having deteriorated with the deterioration determination method shown in FIG. 8.

The deterioration determination method for the rechargeable battery 10 in the preferred embodiment uses the battery temperature estimation method described above. The deterioration determination method for the rechargeable battery 10 in the preferred embodiment is also implemented by operating the controller 1 for the rechargeable battery 10 in FIG. 1.

The deterioration determination method for the rechargeable battery 10 in the preferred embodiment makes use of the decrease in the accuracy of the estimated battery temperature, which is obtained with the battery temperature estimation method of the preferred embodiment shown in FIGS. 4 to 6, resulting from deterioration of the rechargeable battery. The deterioration determination process shown in FIG. 8 is also performed at predetermined time intervals in the same manner as the process shown in FIG. 4. In the preferred embodiment, the predetermined time for the deterioration determination process is 60 seconds.

As shown in FIG. 8, the calculation unit 5 first specifies the battery temperature (actual battery temperature Td) measured using the temperature sensor 17 arranged in the middle of the battery case 12 (refer to FIG. 1) from the temperature data provided from the temperature measurement unit 2 (step S31). The actual battery temperature Td may alternatively be an average value of the battery temperatures measured by each of the temperature sensors 17 or the highest or lowest one of the battery temperatures measured by the temperature sensors 17.

Next, the calculation unit 5 reads the latest estimated battery temperature $T_m$ stored in the storage unit 8 in step S10 shown in FIG. 4 (step S32). The calculation unit 5 further obtains the difference between the read estimated battery temperature $T_m$ and the actual battery temperature Td specified in step S31 to determine whether an absolute value of the difference $|Td-T_m|$ is greater than or equal to the reference value C (step S33).

When the absolute value $|Td-T_m|$ is greater than or equal to the reference value C, the calculation unit 5 sets the value of an abnormality determination counter X to zero (step S37) and terminates the deterioration determination process. When the absolute value $|Td-T_m|$ is greater than or equal to the reference value C, the calculation unit 5 adds one to the value of the abnormality determination counter X (step S34). In the preferred embodiment, the abnormality determination counter X is stored in the storage unit 8 as a parameter. The calculation unit 5 adds one to the value of the parameter X in step S34.

The reference value C is set in advance through discharging experiments. More specifically, the absolute value $|Td-T_m|$ (hereafter referred to as A), which is obtained in a normal state for the rechargeable battery 10, and the temperature increase B, which is an increase in the temperature of the rechargeable battery 10 occurring when the rechargeable battery 10 is subjected to thermal disturbance in an in-vehicle environment, are obtained through discharging experiments. The reference value C is set to satisfy $C \geq (A+B)$. The reference value C may be set to reflect the characteristics of the vehicle. For example, a vehicle applying a large load to the rechargeable battery 10 may have its reference value C set to be large (e.g. C=5). Conversely, a vehicle applying a small load to the rechargeable battery 10 may have its reference value C set to be small (e.g. C=3).

Next, the calculation unit 5 determines whether the value of the abnormality determination counter X has been incremented consecutively and has reached a value greater than or equal to 10 (step S35). When the value of the abnormality determination counter X is less than 10, the calculation unit 5 terminates the deterioration determination process. When the value of the abnormality determination counter X is greater than or equal to 10, the calculation unit 5 performs the processing in step S36.

In step S36, the calculation unit 5 performs an abnormality determination process. More specifically, the calculation unit 5 lowers the maximum value of the discharging power output from the rechargeable battery 10 or the maximum value of the charging power input into the rechargeable battery 10. Further, the calculation unit 5 transmits information on the processing results to the vehicle ECU 22. The calculation unit 5 also transmits information instructing a rise in the fan speed of the fan 15 to the cooling device control unit 7.

The determination criterion used in step S35 is not limited to the value X being incremented consecutively and reaching ten. The maximum value of the consecutively incremented value X set as the determination criterion in step S35 may be appropriately changed to avoid erroneous determination in accordance with various elements, such as the heat capacity of the rechargeable battery 10, deterioration factors of the rechargeable battery 10, and heat generation amounts assumed in the deteriorating state of the rechargeable battery 10.

As shown in FIG. 9, the difference between the actual battery temperature Td and the estimated battery temperature Tm is monitored through the processing in steps S31 to S36 shown in FIG. 8. When the difference is large, the rechargeable battery 10 is determined as having deteriorated (determined as having an abnormality). The deterioration determination method for the rechargeable battery 10 in the preferred embodiment enables sensitive detection of thermal changes in the rechargeable battery 10 caused by abnormalities occurring in the rechargeable battery 10. As compared with when the deterioration determination is based on an increase in the internal resistance of the rechargeable battery 10 or a decrease in the terminal voltage of the rechargeable battery 10, the deterioration of the rechargeable battery 10 is detected earlier with the deterioration determination method of the preferred embodiment.

It should be apparent to those skilled in the art that the present invention may be embodied in many other specific forms without departing from the spirit or scope of the invention. Particularly, it should be understood that the present invention may be embodied in the following forms.

The battery ECU 1 in the preferred embodiment may be realized by installing programs enabling the processes shown in FIGS. 4 to 6 and the process shown in FIG. 8 on a microcomputer and executing these programs. In this case, a CPU (central processing unit) of the microcomputer functions as the calculation unit 5 or as the cooling device control unit 7. A circuit connected to each battery block (A/D conversion circuit etc.) together with the CPU functions as the voltage measurement unit 3. A connecting circuit (A/D conversion circuit etc.) of the current sensor 18 together with the CPU functions as the current measurement unit 2. A connecting circuit (A/D conversion circuit etc.) of each of the temperature sensors 17 and 21 together with the CPU functions as the temperature measurement unit 2. Further, a circuit connected to the vehicle ECU 22 together with the CPU functions as the communication unit 6. Memory included in the microcomputer functions as the storage unit 8.

When the vehicle is an HEV, the vehicle ECU may also function as the battery ECU. In this case, the battery ECU 1 may be realized by installing programs enabling the processes shown in FIGS. 4 to 6 and the process shown in FIG. 8 on a microcomputer forming the vehicle ECU 22 and executing these programs.

The applications for the rechargeable battery controller, the rechargeable battery temperature estimation method, and the rechargeable battery deterioration determination method of the present invention should not be limited to a rechargeable battery mounted on an HEV. For example, the preferred embodiment of the present invention described above may be applicable to rechargeable batteries mounted on various apparatuses such as a solar power generation apparatus (solar battery), a fuel battery, a wind power generation apparatus, a water power generation apparatus, and a thermal power generation apparatus including an internal combustion engine such as a gas-turbine engine.

The rechargeable battery controller, the rechargeable battery temperature estimation method, and the rechargeable battery deterioration determination method of the present invention are effective for a power supply system combining an independent power supply, such as a fuel battery, a solar battery, or a power generator driven using power, with a rechargeable battery. The rechargeable battery controller, the rechargeable battery temperature estimation method, and the rechargeable battery deterioration determination method of the present invention have industrial applicability.

The present examples and embodiments are to be considered as illustrative and not restrictive, and the invention is not to be limited to the details given herein, but may be modified within the scope and equivalence of the appended claims.

What is claimed is:

1. A controller for a rechargeable battery, wherein the rechargeable battery has a temperature sensor connected thereto, the temperature sensor measuring temperature of the rechargeable battery, the controller comprising:
a calculation unit which when operated calculates a heat generation amount of Joule heat generated in the rechargeable battery and a heat generation amount of chemical reaction heat generated in the rechargeable battery, and calculates a battery temperature of the rechargeable battery using a total heat amount of the Joule heat generation amount and the chemical reaction heat generation amount, wherein the calculation unit:
uses the total heat amount to calculate the battery temperature of the rechargeable battery as a first battery temperature,
uses a signal provided from the temperature sensor to determine a second battery temperature of the rechargeable battery, and
determines whether the rechargeable battery has deteriorated using the first battery temperature and the second battery temperature.

2. The controller according to claim 1, further comprising:
a current measurement unit which measures current value of current when the rechargeable battery is being charged or discharged; and
a storage unit;
wherein the calculation unit calculates the battery temperature and stores the battery temperature in the storage unit at predetermined time intervals, and calculates the chemical reaction heat amount using a latest battery temperature stored in the storage unit and the current value measured by the current measurement unit.

3. The controller according to claim 1, wherein:
the rechargeable battery has a cooling device connected thereto, the cooling device having a predetermined cooling capability for cooling the rechargeable battery; and
the calculation unit calculates the battery temperature of the rechargeable battery using the Joule heat generation amount, the chemical reaction heat generation amount, and a value indicating the cooling capability of the cooling device.

4. The controller according to claim 1, wherein the calculation unit corrects the total heat amount in accordance with the time required for the heat generated in the rechargeable battery to be conducted to the temperature sensor, and calculates the first battery temperature using the corrected total heat amount.

5. The controller according to claim 1, wherein the rechargeable battery is mounted on a vehicle including an internal combustion engine and a motor functioning as power sources, and the rechargeable battery supplies power to the motor.

6. The controller according to claim 1, further comprising:
a current measurement unit which measures current value of current when the rechargeable battery is being charged or discharged;
wherein the calculation unit calculates a value of internal resistance of the rechargeable battery, and calculates the Joule heat generation amount using the calculated value of the internal resistance and the current value measured by the current measurement unit.

7. The controller according to claim 6, wherein the calculation unit detects an elapsed time from when direction of the current is switched in the rechargeable battery, corrects the value of the internal resistance in accordance with the detected elapsed time, and calculates the Joule heat generation amount using the corrected value of the internal resistance and the measured current value.

8. A method for estimating the temperature of a rechargeable battery to determine deterioration of the rechargeable battery, the method comprising:
calculating a heat generation amount of Joule heat generated in the rechargeable battery;
calculating a heat generation amount of chemical reaction heat generated in the rechargeable battery;
calculating a battery temperature of the rechargeable battery using the total heat amount of the Joule heat generation amount and the chemical reaction heat generation amount; and
determining whether the rechargeable battery has deteriorated by comparing the calculated battery temperature with a measured battery temperature.

9. The method according to claim 8, wherein said calculating a heat generation amount of Joule heat, said calculating a heat generation amount of chemical reaction heat, and said calculating a battery temperature of the rechargeable battery are performed at predetermined time intervals, the method further comprising:
measuring current value of current when the rechargeable battery is being charged or discharged; and
storing the calculated battery temperature in a storage unit at the predetermined time intervals;
wherein said calculating a heat generation amount of chemical reaction heat includes calculating the chemical reaction heat amount using a latest battery temperature stored in the storage unit and the measured current value.

10. The method according to claim 8, wherein:
the rechargeable battery has a cooling device connected thereto, the cooling device having a predetermined cooling capability for cooling the rechargeable battery; and
said calculating a battery temperature of the rechargeable battery includes calculating the battery temperature of the rechargeable battery using the Joule heat generation amount, the chemical reaction heat generation amount, and a value indicating the cooling capability of the cooling device.

11. The method according to claim 8, further comprising:
measuring current value of current when the rechargeable battery is being charged or discharged;
wherein said calculating a heat generation amount of Joule heat includes calculating a value of internal resistance of the rechargeable battery, and calculating the Joule heat generation amount using the calculated value of the internal resistance and the measured current value.

12. The method according to claim 11, wherein said calculating a heat generation amount of Joule heat includes detecting an elapsed time from when direction of the current is switched in the rechargeable battery, correcting the value of the internal resistance in accordance with the detected elapsed time, and calculating the Joule heat generation amount using the corrected value of the internal resistance and the measured current value.

13. A method for determining deterioration of a rechargeable battery, the method comprising:
calculating a heat generation amount of Joule heat generated in the rechargeable battery;
calculating a heat generation amount of chemical reaction heat generated in the rechargeable battery;
calculating a first battery temperature of the rechargeable battery using the total heat amount of the Joule heat generation amount and the chemical reaction heat generation amount;
determining a second battery temperature of the rechargeable battery based on a signal provided from a temperature sensor connected to the rechargeable battery; and
determining whether the rechargeable battery has deteriorated using the first battery temperature and the second battery temperature.

14. The method according to claim 13, wherein said calculating a first battery temperature includes correcting the total heat amount in accordance with the time required for the heat generated in the rechargeable battery to be conducted to the temperature sensor, and calculating the first battery temperature using the corrected total heat amount.

15. A computer-readable product encoded with computer-readable program instructions for execution by a computer for estimating the temperature of a rechargeable battery to determine whether the rechargeable battery has deteriorated, the program instructions when executed performing steps comprising:
calculating a heat generation amount of Joule heat generated in the rechargeable battery;
calculating a heat generation amount of chemical reaction heat generated in the rechargeable battery;
calculating a battery temperature of the rechargeable battery using the total heat amount of the Joule heat generation amount and the chemical reaction heat generation amount; and
determining that the rechargeable battery has deteriorated when a difference between the calculated battery temperate and a measured temperature is greater than or equal to a reference value.

16. The computer-readable product according to claim 15, wherein said calculating a heat generation amount of Joule heat, said calculating a heat generation amount of chemical reaction heat, and said calculating a battery temperature of the rechargeable battery are performed at predetermined time intervals, the program instructions when executed further performing steps comprising:
measuring current value of current when the rechargeable battery is being charged or discharged; and
storing the calculated battery temperature in a storage unit at the predetermined time intervals;
wherein said calculating a heat generation amount of chemical reaction heat includes calculating the chemical reaction heat amount using a latest battery temperature stored in the storage unit and the measured current value.

17. The computer-readable product according to claim 15, wherein the program instructions when executed further performing steps comprising:
measuring current value of current when the rechargeable battery is being charged or discharged;
wherein said calculating a heat generation amount of Joule heat includes calculating a value of internal resistance of the rechargeable battery, and calculating the Joule heat generation amount using the calculated value of the internal resistance and the measured current value.

18. The computer-readable product according to claim 15, wherein:
the rechargeable battery has a cooling device connected thereto, the cooling device having a predetermined cooling capability for cooling the rechargeable battery; and
said calculating a battery temperature of the rechargeable battery includes calculating the battery temperature of the rechargeable battery using the Joule heat generation amount, the chemical reaction heat generation amount, and a value indicating the cooling capability of the cooling device.

19. A computer-readable product encoded with program instructions for execution by a computer for determining deterioration of a rechargeable battery, the program instructions when executed performing steps comprising:
calculating a heat generation amount of Joule heat generated in the rechargeable battery;
calculating a heat generation amount of chemical reaction heat generated in the rechargeable battery;
calculating a first battery temperature of the rechargeable battery using the total heat amount of the Joule heat generation amount and the chemical reaction heat generation amount;
determining a second battery temperature of the rechargeable battery based on a signal provided from a temperature sensor connected to the rechargeable battery; and
determining whether the rechargeable battery has deteriorated using the first battery temperature and the second battery temperature.

20. The computer-readable product according to claim 15, wherein:
the measured temperature is an average temperature;
the reference value is determined through discharging experiments;
determining whether the rechargeable battery has deteriorated further comprises:
using an abnormality determination counter to count each time the difference is greater than or equal to the reference value; and
initiating an abnormality determination process when the abnormality determination counter exceeds a predetermined value.

* * * * *

UNITED STATES PATENT AND TRADEMARK OFFICE
CERTIFICATE OF CORRECTION

PATENT NO. : 7,646,176 B2  Page 1 of 1
APPLICATION NO. : 11/564459
DATED : January 12, 2010
INVENTOR(S) : Takao Yamamoto It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 456 days.

Signed and Sealed this

Sixteenth Day of November, 2010

David J. Kappos
*Director of the United States Patent and Trademark Office*